United States Patent
Zhang et al.

(10) Patent No.: US 10,329,666 B2
(45) Date of Patent: Jun. 25, 2019

(54) VAPOR DEPOSITION APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Rui Zhang, Beijing (CN); Duanming Li, Beijing (CN); Kuohua Liao, Beijing (CN); Beum Ku Park, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 199 days.

(21) Appl. No.: 15/327,024

(22) PCT Filed: Jan. 5, 2016

(86) PCT No.: PCT/CN2016/070139
§ 371 (c)(1),
(2) Date: Jan. 17, 2017

(87) PCT Pub. No.: WO2017/020544
PCT Pub. Date: Feb. 9, 2017

(65) Prior Publication Data
US 2017/0204517 A1    Jul. 20, 2017

(30) Foreign Application Priority Data
Jul. 31, 2015    (CN) .......................... 2015 1 0465152

(51) Int. Cl.
C23C 16/44     (2006.01)
H01J 37/32     (2006.01)
(Continued)

(52) U.S. Cl.
CPC ...... *C23C 16/4401* (2013.01); *C23C 16/4405* (2013.01); *C23C 16/452* (2013.01);
(Continued)

(58) Field of Classification Search
CPC .............. C23C 16/4401; C23C 16/452; C23C 16/4405; C23C 16/45561; C23C 16/52;
(Continued)

(56) References Cited

U.S. PATENT DOCUMENTS 3,919,975 A * 11/1975 Duncan ..................... A01J 5/01
                                                      119/14.05
5,141,403 A *  8/1992 Guo ....................... A01J 5/048
                                                      119/14.25
(Continued)

FOREIGN PATENT DOCUMENTS

CN        1565046 A      1/2005
CN      102094186 A      6/2011
(Continued)

OTHER PUBLICATIONS

International Search Report and Written Opinion (including English translation of Box V) from PCT Application Serial No. PCT/CN2016/070139, dated May 3, 2016.
(Continued)

*Primary Examiner* — Jeffrie R Lund
(74) *Attorney, Agent, or Firm* — Kinney & Lange, P.A.

(57) ABSTRACT

A vapor deposition apparatus, including: a reaction device having a reaction chamber; a first gas duct connected to the reaction chamber and configured to direct a process gas into the reaction chamber; a gas ionization device connected to the reaction device and configured to ionize a cleaning gas; and a second gas duct connected to the gas ionization device and configured to direct the cleaning gas into the gas ionization device; a common gas duct; and a three-way
(Continued)

control mechanism. An end of the common gas duct is connected to the reaction chamber and the other end of the common gas duct is connected to a first gas port of the three-way control mechanism; the first gas duct and the gas ionization device are connected to a second gas port and a third gas port of the three-way control mechanism, respectively.

7 Claims, 3 Drawing Sheets

(51) Int. Cl.
    *C23C 16/455*     (2006.01)
    *C23C 16/452*     (2006.01)
    *C23C 16/52*     (2006.01)
    *C23C 16/50*     (2006.01)

(52) U.S. Cl.
    CPC ...... *C23C 16/455* (2013.01); *C23C 16/45561* (2013.01); *C23C 16/50* (2013.01); *C23C 16/52* (2013.01); *H01J 37/3244* (2013.01); *H01J 37/32357* (2013.01)

(58) Field of Classification Search
    CPC .... C23C 16/50; C23C 16/455; H01J 37/3244; H01J 37/32357
    See application file for complete search history.

(56) References Cited

U.S. PATENT DOCUMENTS

| | | | |
|---|---|---|---|
| 6,194,038 B1* | 2/2001 | Rossman | C23C 16/045 257/E21.243 |
| 8,017,527 B1* | 9/2011 | Dhas | C23C 16/4401 118/29 |
| 2002/0011210 A1 | 1/2002 | Satoh et al. | |
| 2003/0101938 A1* | 6/2003 | Ronsse | C23C 16/407 118/726 |
| 2004/0043544 A1* | 3/2004 | Asai | C23C 16/0218 438/149 |
| 2004/0144311 A1* | 7/2004 | Chen | C23C 16/45502 118/715 |
| 2013/0048216 A1 | 2/2013 | Yin et al. | |
| 2013/0122713 A1* | 5/2013 | Rogers | H01L 27/11521 438/715 |
| 2015/0361583 A1* | 12/2015 | Zheng | C30B 25/14 117/102 |
| 2017/0204517 A1* | 7/2017 | Zhang | C23C 16/455 |

FOREIGN PATENT DOCUMENTS

| | | |
|---|---|---|
| CN | 13572253 A | 2/2014 |
| CN | 103732972 A | 4/2014 |
| CN | 203794981 U | 8/2014 |
| CN | 104962880 A | 10/2015 |
| JP | 2009194006 A | 8/2009 |

OTHER PUBLICATIONS

First Chinese Office Action, for Chinese Patent Application No. 201510465152.3, dated Mar. 2, 2017, 15 pages.
Second Chinese Office Action, for Chinese Patent Application No. 201510465152.3, dated Aug. 4, 2017, 14 pages.

\* cited by examiner

VAPOR DEPOSITION APPARATUS

CROSS-REFERENCE TO RELATED APPLICATION

This application is a Section 371 National Stage Application of International Application No. PCT/CN2016/070139, filed on Jan. 5, 2016, entitled "VAPOR DEPOSITION APPARATUS", which has not yet published, which claims priority to Chinese Application No. 201510465152.3, filed on Jul. 31, 2015, incorporated herein by reference in their entirety.

BACKGROUND OF THE DISCLOSURE

Field of the Disclosure

The present disclosure relates to a field of manufacturing a display device, in particular, to a vapor deposition apparatus for coating a glass substrate.

Description of the Related Art

A vapor deposition is a common film coating process. For example, in a display technical field, it is typically required to carry out multiple plasma chemical vapor deposition processes to coat a base substrate (for example, a glass substrate) in a reaction chamber, so as to form a functional pattern. However, after the film coating process is carried out on the glass substrate for a period of time, redundant films may be deposited on an inner wall of the reaction chamber of the vapor deposition apparatus, thereby affecting a product yield rate adversely.

The process gas and the cleaning gas from respective gas sources flow through two ducts respectively, converge into one path at an ionization device, then enter the reaction chamber. One of the process gas and the cleaning gas may be selected by controlling a valve, according to actual requirements.

However, there is also a small chamber inside the ionization device. An oxide film is coated on an inner wall of the chamber. As the ionization device is becoming aging, the oxide film on the inner wall of the chamber may be exfoliated to form exfoliated particles. If the process gas is supplied into the reaction chamber through the chamber of the ionization device, the exfoliated particles in the chamber of the ionization device may be supplied into the reaction chamber along with the process gas, thereby affecting the product yield rate adversely.

SUMMARY

According to an aspect of the present disclosure, it is provided a vapor deposition apparatus, comprising:

a reaction device having a reaction chamber;

a first gas duct connected to the reaction chamber and configured to direct a process gas for deposition into the reaction chamber;

a gas ionization device connected to the reaction device and configured to ionize a cleaning gas; and a second gas duct connected to the gas ionization device and configured to direct the cleaning gas for cleaning the reaction chamber into the gas ionization device.

According to some embodiments, the vapor deposition apparatus further comprises a common gas duct, wherein the process gas is supplied into the reaction chamber by passing through the first gas duct and the common gas duct in order, and the cleaning gas is supplied into the reaction chamber by passing through the second gas duct, the gas ionization device and the common gas duct in order.

According to some embodiments, the reaction device further has a first port and a second port, and wherein the process gas is supplied into the reaction chamber from the first port by passing through the first gas duct and the cleaning gas is supplied into the reaction chamber from the second port by passing through the second gas duct and the gas ionization device in order.

According to some embodiments, the vapor deposition apparatus further comprises a common gas duct and a three-way control mechanism, wherein, an end of the common gas duct is connected to the reaction chamber and the other end of the common gas duct is connected to a first gas port of the three-way control mechanism;

the first gas duct and the gas ionization device are connected to a second gas port and a third gas port of the three-way control mechanism in a one-to-one correspondence; and the three-way control mechanism is configured to control the common gas duct to communicate with the first gas duct or the gas ionization device, or to stop the common gas duct communicating with both the first gas duct and the gas ionization device.

According to some embodiments, the three-way control mechanism comprises a dual vacuum system having a switch mechanism.

According to some embodiments, the switch mechanism is a valve for dual vacuum system, and the gas ionization device is a remote plasma source.

According to some embodiments, the dual vacuum system comprises:

a first vacuum chamber communicated with the first gas duct;

a second vacuum chamber communicated with the gas ionization device; and the switch mechanism which is configured such that the common gas duct is communicated with the first vacuum chamber or the second vacuum chamber, or the common gas duct is stopped communicating with both the first vacuum chamber and the second vacuum chamber.

According to some embodiments, the vapor deposition apparatus further comprises:

a first control mechanism disposed in the first gas duct and configured for opening or closing the first gas duct; and/or a second control mechanism disposed in the second gas duct and configured for opening or closing the second gas duct.

According to some embodiments, the vapor deposition apparatus further comprises a process gas source for supplying the process gas and a cleaning gas source for supplying the cleaning gas.

According to some embodiments, the common gas duct is formed of ceramic material.

According to some embodiments, the reaction device comprises an upper electrode and a lower electrode, which are opposite to each other in the reaction chamber and configured for generating an electric field in the reaction chamber to ionize the process gas into plasma.

According to some embodiments, the reaction device further comprises a matching box configured for matching a radio-frequency voltage applied on the upper electrode to obtain a minimum reflected power.

BRIEF DESCRIPTION OF THE DRAWINGS

Preferable embodiments of the present disclosure will be described with reference to accompanying drawings by way of examples. In the drawings.

DETAILED DESCRIPTION OF PREFERRED EMBODIMENTS OF THE DISCLOSURE

Figure 1A:
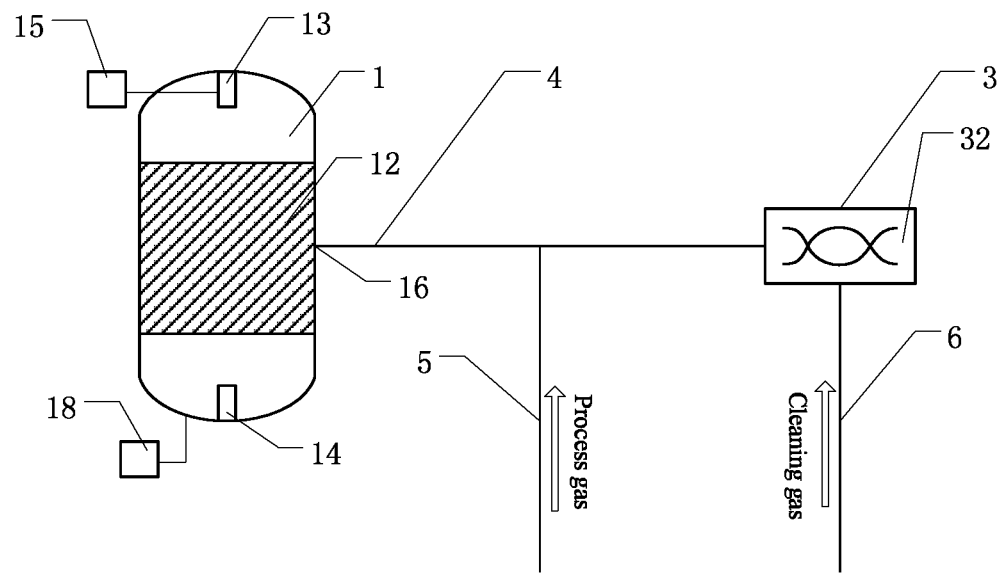
FIG. 1A is a schematic structural view of a vapor deposition apparatus according to an embodiment of the present disclosure, in which the process gas and the cleaning gas are supplied into a reaction chamber through a common gas duct.

In order to make the objects, technical solutions and advantages of the present disclosure become clearer, the present disclosure will be further explained in detail with reference to the embodiments and drawings below. It should be understood that the present disclosure is not limited to the details described hereinafter or illustrated in the drawings. These details are described for purpose of explaining rather than limiting, so that those skilled in the art can understand the present disclosure more thoroughly. It should be understood for those skilled in the art that the solutions of the present disclosure may also be implemented without these specific details.

It should be noted that, in the context, the expressions "connected" and "connecting" may indicate that two components are directly connected, or may also indicate that two components are indirectly connected through an intermediate third component. The expressions "communicated" and "communicating" may indicate that inner passages of two components are directly connected, or may also indicate that two components are indirectly communicated through an intermediate third component.

FIG. 1A is a schematic structural view of a vapor deposition apparatus according to an embodiment of the present disclosure. As shown in FIG. 1A, the vapor deposition apparatus may comprise: a reaction device 1 having a reaction chamber 12; a first gas duct 5 connected to the reaction chamber 12 and configured to direct a process gas for deposition into the reaction chamber 12; a gas ionization device 3 connected to the reaction device 1 and configured to ionize a cleaning gas; and a second gas duct 6 connected to the gas ionization device 3 and configured to direct the cleaning gas for cleaning the reaction chamber 12 into the gas ionization device 3.

Generally, a dry etching process is used to clean the reaction chamber so as to remove films on an inner wall thereof. During the dry etching process, an ionization device, for example, a remote plasma source (RPS) or the like, may be used to ionize the cleaning gas such as nitrogen trifluoride ($NF_3$), ions obtained by the ionization are then fed into the reaction chamber to make a chemical reaction with components of the films on the inner wall, so as to realize the cleaning process. The vapor deposition apparatus according to the embodiment of the present disclosure as shown in FIG. 1A may be applied to coat a workpiece or a substrate, and also to clean the reaction chamber so as to clean off films coated on the inner wall of the reaction chamber after the coating process. During the coating process, the process gas is supplied into the reaction chamber 12 through the first gas duct 5, without passing through the gas ionization device 3. During the cleaning process, the cleaning gas is supplied into the gas ionization device 3 through the second gas duct 6 and is then supplied into the reaction chamber 12 after being ionized, without passing through the first gas duct 5. In this way, exfoliated particles exfoliated inside the chamber 32 of the gas ionization device due to aging or other reasons are not supplied into the reaction chamber 12 along with the process gas, thereby increasing a product yield rate. Moreover, the exfoliated particles inside the chamber 32 of the gas ionization device are only supplied into the reaction chamber 12 along with the cleaning gas, and are pumped out along with the cleaning gas by a vacuum pump 18 after the cleaning process is completed, so that the exfoliated particles may not affect the yield rate of the product produced during the process such as the coating process.

It should be understood that the vapor deposition apparatus illustrated in FIG. 1A may be a plasma chemical vapor deposition apparatus performing plasma chemical vapor deposition process, or may also be a vapor deposition apparatus performing physical, chemical or other types of vapor deposition processes.

In a case that the vapor deposition apparatus illustrated in FIG. 1A is a plasma chemical vapor deposition apparatus performing plasma chemical vapor deposition process, the reaction device may further comprise an upper electrode 13 and a lower electrode 14, which are opposite to each other in the reaction chamber 12 and configured for generating an electric field in the reaction chamber 12 to ionize the process gas into plasma. In some embodiments, the reaction device 1 may further comprise a matching box 15 configured for matching a radio-frequency voltage applied on the upper electrode 13 to obtain a minimum reflected power. According to an example, the used radio-frequency voltage is a radio-frequency voltage of 13.56 MHZ.

The reaction device 1 may comprise the upper electrode 13 and the lower electrode 14, between which the electric field may be generated. The process gas supplied into the reaction chamber 12 is ionized into the plasma state under an effect of the electric field generated between the upper electrode 13 and the lower electrode 14, then is bound with reacted atoms to generate a desired film. As a result, the plasma chemical vapor deposition is realized.

Figure 1B:
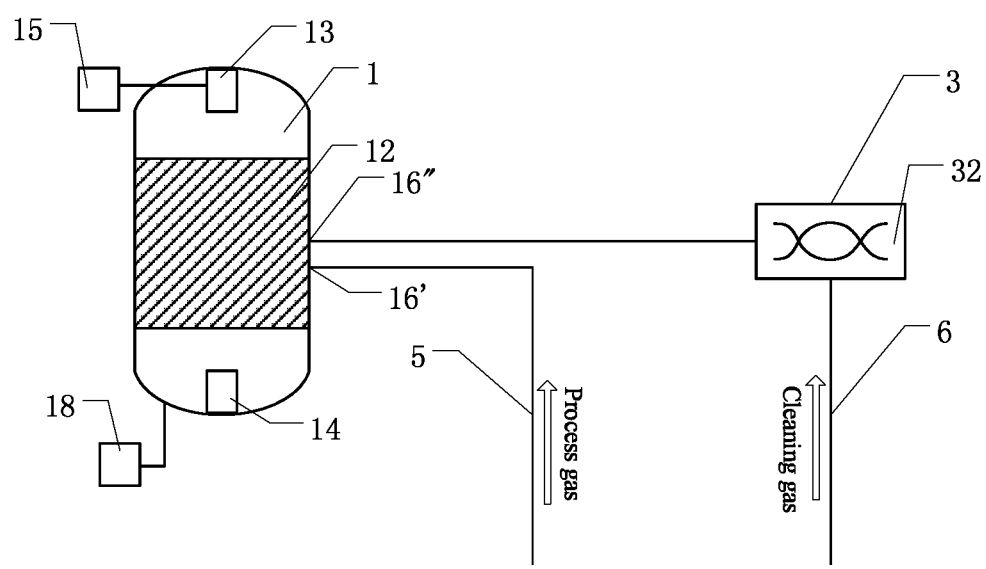
FIG. 1B is a schematic structural view of a vapor deposition apparatus according to an embodiment of the present disclosure, in which the process gas and the cleaning gas are supplied into a reaction chamber through different ports.

In the vapor deposition apparatus illustrated in FIG. 1A, both the process gas and the cleaning gas are finally communicated to a gas inlet 16 of the process chamber 12 through a common gas duct or a gas feeding duct 4. However, in other embodiments, the process gas and the cleaning gas may be communicated to different gas inlets 16', 16" of the process chamber, respectively, as shown in FIG. 1B.

Figure 2:
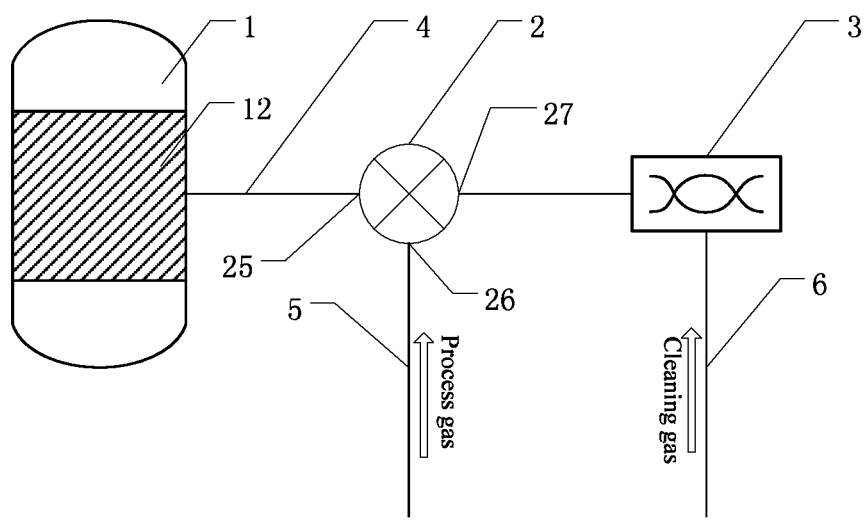
FIG. 2 is a schematic structural view of a vapor deposition apparatus having a three-way control mechanism according to an embodiment of the present disclosure.

FIG. 2 is a schematic structural view of a vapor deposition apparatus according to an embodiment of the present disclosure. As shown in FIG. 2, the vapor deposition apparatus may comprise: a reaction device 1 having a reaction chamber 12; a first gas duct 5 connected to the reaction chamber 12 and configured to direct a process gas for deposition into the reaction chamber 12; a gas ionization device 3 connected to the reaction device 1 and configured to ionize a cleaning gas; and a second gas duct 6 connected to the gas ionizadevice 3 and configured to direct the cleaning gas for cleaning the reaction chamber 12 into the gas ionization device 3.

Further, the vapor deposition apparatus may comprise a common gas duct 4 and a three-way control mechanism 2. An end of the common gas duct 4 is connected to the reaction chamber 12 and the other end of the common gas duct 4 is connected to a first gas port 25 (left gas port of the three-way control mechanism 2 shown in FIG. 2) of the three-way control mechanism 2. The first gas duct 5 and the gas ionization device 3 are connected to a second gas port 26 (downside gas port of the three-way control mechanism 2 shown in FIG. 2) and a third gas port 27 (right gas port of the three-way control mechanism 2 shown in FIG. 2) of the three-way control mechanism 2, respectively. The three-way control mechanism 2 is configured to control the common gas duct 4 to communicate with the first gas duct 5 or the gas ionization device 3, or to stop the common gas duct 4 communicating with both the first gas duct 5 and the gas ionization device 3.

In the vapor deposition apparatus according to the embodiment of the present disclosure illustrated in FIG. 2, both the process gas and the cleaning gas are communicated to the reaction chamber 12 through the common gas duct 4, thus it is not necessary to modify the existing reaction chamber, thereby reduce efficiently a manufacturing cost of the vapor deposition apparatus.

In the embodiments illustrated in FIGS. 1A and 2, the reaction chamber 12 of the reaction device 1 is in a vacuum and high-temperature state in operation (i.e. during coating process), thus the ducts (the first gas duct 5, the second gas duct 6 and/or the common gas duct 4) connected directly to the reaction chamber 12 are typically made of high temperature-resistant material, in the vapor deposition apparatus illustrated in FIGS. 1A and 2.

As an example, these ducts 4, 5, 6 may be made of ceramic material. In this way, damage to the ducts due to high temperature may be prevented. In the case where the common gas duct is used, only the common gas duct 4 may be made of high temperature-resistant material such as ceramic. In this way, the first gas duct 5 and/or the second gas duct 6 may be provided or manufactured in a lower cost.

Figure 3:
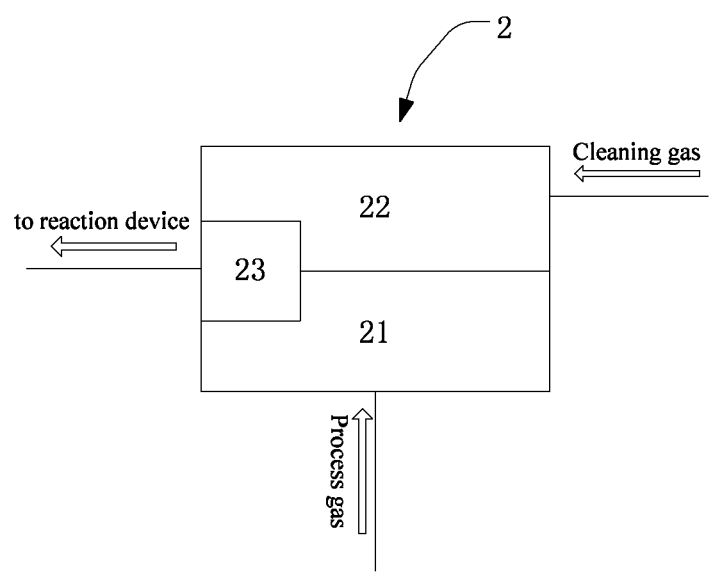
FIG. 3 is a schematic structural view of an example of a three-way control mechanism.

In an example, the three-way control mechanism 2 may comprise a dual vacuum system (DVS) having a switch mechanism. FIG. 3 is a schematic structural view of a dual vacuum system.

As shown in FIG. 3, the dual vacuum system may comprise: a first vacuum chamber 21 communicated with the first gas duct 5; a second vacuum chamber 22 communicated with the gas ionization device 3; and a switch mechanism 23. The switch mechanism 23 may be switched such that the common gas duct 4 is communicated with the first vacuum chamber 21 or the second vacuum chamber 22, or the common gas duct 4 is stopped communicating with both the first vacuum chamber 21 and the second vacuum chamber 22.

As stated above, the dual vacuum system 2 is provided between the reaction chamber 12 and the gas ionization device 3, that is, a vacuum isolation is provided between the reaction chamber 12 and the gas ionization device 3. As a result, in a case that the gas ionization device is needed to be replaced or maintained, it is only required to operate the switch mechanism 23 of the dual vacuum system 2 so as to cut off the communication between the common gas duct 4 and the second vacuum chamber 22 and close the second gas duct 6. In this way, the gas ionization device 3 may be isolated from the whole vapor deposition apparatus. Therefore, the gas ionization device may be replaced and maintained without cooling and inflating the reaction chamber or the whole vapor deposition apparatus.

By using the above configuration, the replacement and maintaining operations of the gas ionization device may not be affected by the reaction chamber. Also, the vacuum state in the reaction chamber may still be kept during the replacement and maintaining operations of the gas ionization device. Therefore, a utilization of the vapor deposition apparatus may be notably increased, thereby increasing productivity.

In some embodiments, the switch mechanism 23 may be a valve for dual vacuum system, and the gas ionization device 3 may be a remote plasma source (RPS).

Figure 4:
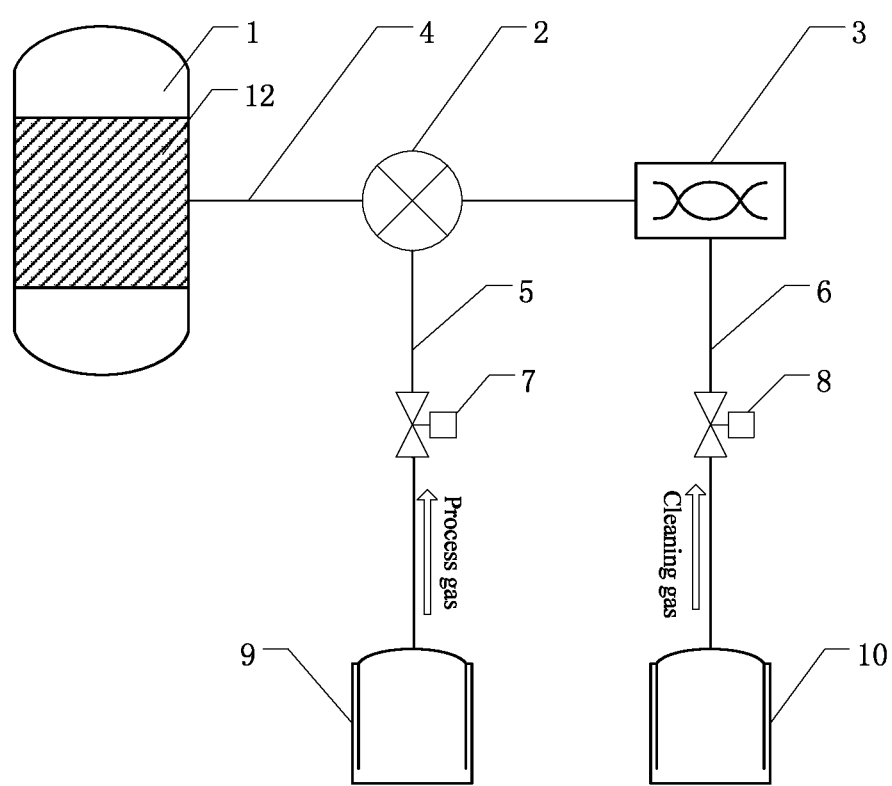
FIG. 4 is a schematic structural view of a vapor deposition apparatus having gas sources and control mechanisms according to an embodiment of the present disclosure.

In other embodiments, as shown in FIG. 4, the vapor deposition apparatus may further comprise: a first control mechanism 7 disposed in the first gas duct 5; and/or a second control mechanism 8 disposed in the second gas duct 6. The first control mechanism 7 is configured for opening or closing the first gas duct 5 to bring the first gas duct 5 into a communication state or non-communication state, so as to allow the process gas to or not to pass through the first gas duct 5. The second control mechanism 8 is configured for opening or closing the second gas duct 6 to bring the second gas duct 6 into a communication state or non-communication state, so as to allow the cleaning gas to or not to pass through the second gas duct 6.

It should be noted that, in other embodiments, only the first control mechanism 7 or only the second control mechanism 8 may be provided.

If the process gas is needed to flow into the reaction chamber 12, the first control mechanism 7 may be operated so that the first gas duct 5 is in the communication state. If the process gas is not needed to flow into the reaction chamber 12, the first control mechanism 7 may be operated so that the first gas duct 5 is in a closed state. In this way, problems related to coating films, which are caused by the process gas supplied into the reaction chamber 12 when the process gas is not needed to flow into the reaction chamber, may be avoided effectively.

If the reaction chamber 12 is needed to be cleaned, the second control mechanism 8 may be operated so that the second gas duct 6 is in the communication state. In this way, the cleaning gas may be supplied into the gas ionization device 3 and supplied into the reaction chamber 12 after being ionized so as to perform the cleaning operation. If the reaction chamber 12 is not needed to be cleaned, the second control mechanism 8 may be operated so that the second gas duct 6 is in a closed state. In this way, adverse effects on the coating process, which are produced as the cleaning gas is accidentally supplied into the gas ionization device 3 and carries the exfoliated particles in the chamber of the gas ionization device into the reaction chamber 12, may be avoided effectively.

Moreover, in the exemplary embodiment illustrated in FIG. 4, the vapor deposition apparatus may further comprise a process gas source 9 connected to the first gas duct 5 and configured for supplying the process gas, and a cleaning gas source 10 connected to the second gas duct 6 and configured for supplying the cleaning gas. In other embodiments, the process gas source 9 and/or the cleaning gas source 10 may be set on site, or may be set remotely, which depends on a requirement of the process. The process gas source 9 and/or the cleaning gas source 10 may be a gas source specially used for one plasma chemical vapor deposition apparatus, or may be a gas source configured to supply the process gas and/or cleaning gas for a plurality of plasma chemical vapor deposition apparatus.

In other embodiments, the first control mechanism 7 and the second control mechanism 8 may also be arranged at the process gas source 9 and the cleaning gas source 10, respectively.

In some embodiments, the switch mechanism 23, the first control mechanism 7 and the second control mechanism 8 all may comprise suitable valves. For example, FIG. 4 shows a pneumatic valve as the control mechanisms 7, 8. However, the switch mechanism and the control mechanisms may also be hydraulic valves or any other types of valves. Moreover, these valves may be respectively controlled by different controllers, or may be controlled by one common controller.

Next, by taking the plasma chemical vapor deposition apparatus as an example, a work principle of the vapor deposition apparatus according to the embodiment of the present disclosure will be explained in detail in combination with the accompanying drawings and specific embodiments.

The vapor deposition apparatus according to the embodiment of the present disclosure may perform a plasma chemical deposition process to coat films in the reaction chamber and then clean the reaction chamber.

During the coating process, the first control mechanism 7 is operated to open the first gas duct 5 so that the process gas is allowed to flow through the first gas duct 5. Also, the second control mechanism 8 is operated to close the second gas duct 6 so that the cleaning gas is not allowed to flow through the second gas duct 6.

The process gas (for example, reaction gas) from the process gas source 9 flows through the first gas duct 5, the dual vacuum system 2 and the common gas duct 4 in order, so as to be supplied into the reaction chamber of the reaction device 1.

The radio-frequency voltage (13.56 MHz) is transmitted to the upper electrode 13 of the reaction device through the matching box 15, so as to generate an electric field in the reaction chamber 12.

The gas supplied into the reaction chamber 12 is ionized into plasma by the electric field, and a desired film is formed on a workpiece or component to be coated through the chemical vapor deposition process.

During the cleaning process, the cleaning gas (for example, $NF_3$ gas) flows through the second gas duct 7 from the cleaning gas source 10 so as to be supplied into the remote plasma source (RPS) 3 and then is ionized into ions (for example, fluorine ions or $F^+$). Ions (for example, $F^+$) are supplied into the reaction chamber 12 of the reaction device 1 through the dual vacuum system 2 and the common gas duct 4 to react with the redundant films (mainly silicon compounds) on the inner wall of the reaction chamber 12, so as to generate a gas (for example, gaseous $SiF_4$). Then, the gas is pumped out by the vacuum pump 18 to realize an effect of cleaning the reaction chamber 12.

During the replacement of the remote plasma source (RPS), when the RPS is in downtime, the switch mechanism 23 of the dual vacuum system 2, the first control mechanism 7 and the second control mechanism 8 are controlled to bring the ducts where these mechanisms are located into a non-communication state, so that the RPS is isolated from the entire plasma chemical vapor deposition apparatus. Thereafter, the RPS may be removed from the plasma chemical vapor deposition apparatus, and a new RPS may be installed. During the above processes, it is not necessary to cool and inflate the entire plasma chemical vapor deposition apparatus, so that the downtime can be greatly reduced.

The plasma chemical vapor deposition apparatus according to the above embodiments of the present disclosure is capable of providing the following advantages.

Firstly, the dual vacuum system is provided between the reaction chamber (or gas feeding duct) and the remote plasma source (RPS). The dual vacuum system is capable of providing a vacuum isolation between the reaction chamber and the remote plasma source, so that it is not necessary to cool and inflate the reaction chamber when the RPS is needed to be replaced or cleaned. It is only necessary to close the dual vacuum system as well as the first gas duct and the second gas duct, so as to replace the RPS. As a result, the downtime of the RPS may be significantly reduced, a utilization of the plasma chemical vapor deposition apparatus may be increased, and the productivity may be increased.

Secondly, in the above plasma chemical vapor deposition apparatus, the supplying passage (the first gas duct 5) of the process gas is directly connected to the dual vacuum system without passing through the RPS, so that the RPS may be removed more conveniently. Also, as the process gas does not pass through the RPS, the exfoliated particles exfoliated from an oxide film on the inner wall of the RPS do not enter the reaction chamber along with the process gas, which may otherwise reduce the product yield rate. Specifically, the exfoliated particles inside the chamber of the gas ionization device are only supplied into the reaction chamber along with the cleaning gas, and are pumped out along with the cleaning gas by the vacuum pump after the cleaning process is completed, so that the exfoliated particles may not affect the yield rate of the product produced during the process such as the coating process.

Further, on a basis of the DVS and in combination with interfaces of the DVS itself, it is only necessary to redesign a segment of duct from the process gas source to the DVS without modifying other components of the apparatus. Also, the original control system may still be used. Thus, it is not necessary to carry out a large-scale modification on an existing system.

So far, preferable embodiments of the present disclosure have been described in detail by way of examples. It would be appreciated by those skilled in the art that further changes and modifications may be made thereto without departing from the spirit of the disclosure, and all these changes and modifications shall fall within the scope of the present disclosure. Therefore, the scope of the present disclosure is defined by the appended claims.

What is claimed is:

1. A vapor deposition apparatus, comprising:
   a reaction device having a reaction chamber;
   a first gas duct connected to the reaction chamber and configured to direct a process gas for deposition into the reaction chamber;
   a gas ionization device connected to the reaction device and configured to ionize a cleaning gas;
   a second gas duct connected to the gas ionization device and configured to direct the cleaning gas for cleaning the reaction chamber into the gas ionization device;
   a common gas duct; and
   a three-way control mechanism, wherein,
   an end of the common gas duct is connected to the reaction chamber and the other end of the common gas duct is connected to a first gas port of the three-way control mechanism;
   the first gas duct and the gas ionization device are connected to a second gas port and a third gas port of the three-way control mechanism, respectively;

the three-way control mechanism is configured to control the common gas duct to communicate with the first gas duct or the gas ionization device, or to stop the common gas duct communicating with both the first gas duct and the gas ionization device; and the three-way control mechanism comprises:
- a first vacuum chamber communicated with the first gas duct;
- a second vacuum chamber communicated with the gas ionization device; and
- a switch mechanism switchable between a first state wherein the common gas duct is communicated with the first vacuum chamber or the second vacuum chamber, and a second state wherein the common gas duct is prevented from communicating with both the first vacuum chamber and the second vacuum chamber so that a vacuum isolation is provided between the reaction chamber and the gas ionization device.

2. The vapor deposition apparatus according to claim 1, wherein the switch mechanism is a valve, and the gas ionization device is a remote plasma source.

3. The vapor deposition apparatus according to claim 1, further comprising:
- a first control mechanism disposed in the first gas duct and configured for opening or closing the first gas duct; and/or
- a second control mechanism disposed in the second gas duct and configured for opening or closing the second gas duct.

4. The vapor deposition apparatus according to claim 1, further comprising a process gas source for supplying the process gas and a cleaning gas source for supplying the cleaning gas.

5. The vapor deposition apparatus according to claim 1, wherein the common gas duct is formed of ceramic material.

6. The vapor deposition apparatus according to claim 1, wherein the reaction device comprises an upper electrode and a lower electrode, which are opposite to each other in the reaction chamber and configured for generating an electric field in the reaction chamber to ionize the process gas into plasma.

7. The vapor deposition apparatus according to claim 6, wherein the reaction device further comprises a matching box configured for matching a radio-frequency voltage applied on the upper electrode to obtain a minimum reflected power.

* * * * *